(12) United States Patent
Inobe et al.

(10) Patent No.: US 9,872,407 B2
(45) Date of Patent: Jan. 16, 2018

(54) ELECTRONIC DEVICE

(71) Applicant: Sharp Kabushiki Kaisha, Sakai, Osaka (JP)

(72) Inventors: Hiroyuki Inobe, Sakai (JP); Hiroshi Tashiro, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/313,113

(22) PCT Filed: Jul. 27, 2015

(86) PCT No.: PCT/JP2015/003755
§ 371 (c)(1),
(2) Date: Nov. 22, 2016

(87) PCT Pub. No.: WO2016/017141
PCT Pub. Date: Feb. 4, 2016

(65) Prior Publication Data
US 2017/0196108 A1 Jul. 6, 2017

(30) Foreign Application Priority Data
Jul. 29, 2014 (JP) .................................. 2014-153632

(51) Int. Cl.
G06F 1/16 (2006.01)
H05K 5/00 (2006.01)
H05K 5/03 (2006.01)

(52) U.S. Cl.
CPC ............ *H05K 5/03* (2013.01); *G06F 1/1626* (2013.01); *H05K 5/0017* (2013.01)

(58) Field of Classification Search
None
See application file for complete search history.

(56) References Cited

U.S. PATENT DOCUMENTS

| 6,284,087 | B1 | 9/2001 | von Gutfeld et al. | |
| 6,301,417 | B1 * | 10/2001 | Biscardi | G02B 6/08 348/804 |
| 7,745,739 | B2 * | 6/2010 | Ingenbleek | H05K 5/061 174/521 |

(Continued)

FOREIGN PATENT DOCUMENTS

| JP | 2001-054945 A | 2/2001 |
| JP | 2006-163742 A | 6/2006 |

(Continued)

*Primary Examiner* — Xanthia C Cunningham
(74) *Attorney, Agent, or Firm* — Keating & Bennett, LLP

(57) ABSTRACT

Provided is an electronic device including a cover made of a material which is transparent to at least UV, and black printing which is impervious to UV and is applied on a peripheral edge portion of the cover. A cover-bonding portion has an overflow prevention recess into which a UV-curing adhesive applied between the cover-bonding portion and the cover flows. Emitted UV is reflected by a surface of the overflow prevention recess and caused to reach space which is located inward relative to the black printing and between a backside of the peripheral edge portion of the cover and the cover-bonding portion, thereby curing the UV-curing adhesive.

9 Claims, 6 Drawing Sheets

(56) References Cited

U.S. PATENT DOCUMENTS

| | | | | |
|---|---|---|---|---|
| 8,305,763 B2* | 11/2012 | Kato | ............... | H05K 5/006 361/730 |
| 8,337,042 B2* | 12/2012 | Sudo | ............... | G02F 1/133604 362/219 |
| 8,908,380 B2* | 12/2014 | Ohhashi | ............... | H05K 5/0052 174/535 |
| 9,253,899 B2* | 2/2016 | Hongo | ............... | G06F 1/1626 |
| 9,423,653 B2* | 8/2016 | Lee | ............... | G02F 1/133608 |
| 9,428,225 B2* | 8/2016 | Minei | ............... | B62D 27/026 |
| 2004/0195783 A1* | 10/2004 | Akagi | ............... | F16J 15/027 277/645 |
| 2006/0023431 A1* | 2/2006 | Wetzel | ............... | B60R 16/0239 361/739 |
| 2008/0143918 A1* | 6/2008 | Kim | ............... | G02F 1/133608 349/58 |
| 2008/0284697 A1 | 11/2008 | Nam et al. | | |
| 2010/0258458 A1* | 10/2010 | Nommer | ............... | F16J 15/14 206/305 |
| 2013/0242609 A1* | 9/2013 | Mori | ............... | G02B 6/0088 362/611 |
| 2014/0176867 A1* | 6/2014 | Huang | ............... | G02B 6/0081 349/65 |
| 2014/0226452 A1* | 8/2014 | Furuichi | ............... | F16B 47/003 369/100 |
| 2015/0116629 A1* | 4/2015 | Dai | ............... | G02F 1/133308 349/58 |
| 2016/0366773 A1* | 12/2016 | Esterbauer | ............... | H05K 5/0017 |
| 2017/0236481 A1 | 8/2017 | Her et al. | | |

FOREIGN PATENT DOCUMENTS

| | | |
|---|---|---|
| JP | 2008-083702 A | 4/2008 |
| JP | 2014-122979 A | 7/2014 |

\* cited by examiner

ELECTRONIC DEVICE

TECHNICAL FIELD

The present invention relates to an electronic device including a cover which covers a display unit and which is bonded to a cabinet using, in particular, a photo-curable adhesive.

BACKGROUND ART

In an electronic device of the known art such as a smartphone, a cover made of a clear glass plate or a clear acrylic plate and covering a display unit is bonded to a cabinet using a piece of double-sided tape having a frame shape.

The recent increase in the display screen sizes has involved a further reduction of the width of regions to which the double-sided tape adheres, which has made it difficult to ensure a sufficient bonding strength by using the double-sided tape.

To address this problem, it is conceivable to use a photo-curable adhesive, for example. Such a photo-curable adhesive provides high production efficiency since it remains uncured when it is not irradiated with UV or visible light, and is cured by short-time irradiation with UV or visible light. Unfortunately, since a peripheral edge portion of the cover which covers a display unit is provided with black printing to improve the appearance, UV or visible light cannot reach the backside of the black printing.

In view of this, for example, Patent Document 1 describes a method of indirect bonding with the use of a photo-curable adhesive. According to this method, adhesion surfaces to which the photo-curable adhesive is applied are configured as reflection surfaces which reflect light. In this manner, gaps between the reflection surfaces are irradiated with UV or visible light.

CITATION LIST

Patent Document

Patent Document 1: Japanese Unexamined Patent Publication No. 2001-54945

SUMMARY OF THE INVENTION

Technical Problem

According to the method of Patent Document 1, however, if the gaps between the reflection surfaces are narrow or have a large depth, UV or visible light does not reach inner space of the gaps actually. Consequently, the adhesive is cured insufficiently, which makes it impossible to ensure bonding strength.

In view of the foregoing, it is therefore an object of the present invention to maintain, in an electronic device, bonding strength of a cover, while enabling a display unit to have a narrow picture-frame.

Solution to the Problem

To attain the object, the present invention is configured such that UV or visible light is caused to reach an inwardly located portion of a photo-curable adhesive which has flowed into space between the backside of a peripheral edge portion of a cover and a cover-bonding portion.

Specifically, the present invention relates to an electronic device including: a display unit; a cover which covers the display unit; and a cabinet having a cover-bonding portion to which the cover is bonded.

In the electronic device, a peripheral edge portion of the cover is provided with a light-shielding treatment which is little transparent to or impervious to UV or visible light, and the cover-bonding portion has a recess into which a photo-curable adhesive provided between the cover-bonding portion and the peripheral edge portion of the cover flows.

The electronic device is configured such that emitted UV or visible light is reflected by a surface of the recess and caused to reach space which is located inward relative to the light-shielding treatment and which is between a backside of the peripheral edge portion of the cover and a surface of the cover-bonding portion.

In the known art, the light-shielding treatment provided to the cover in order to improve the appearance hinders UV or visible light from reaching space located inward relative to the light-shielding treatment. In contrast, according to the configuration described above, UV or visible light is reflected by the surface of the recess and caused to reach the inner space, which ensures that the photo-curable adhesive is cured and the bonding strength is maintained. Further, since the photo-curable adhesive flows into the recess when it is applied, the photo-curable adhesive is not allowed to overflow. Furthermore, the bonding area according to this configuration is larger, by the area of the recess, than that in a case where the cover-bonding portion has a flat surface. This contributes to an increase in the bonding strength.

Advantages of the Invention

As can be seen from the foregoing, according to the present invention, emitted UV or visible light is reflected by the surface of the recess and caused to reach the space that is located inward relative to the light-shielding treatment and is between the backside of the peripheral edge portion of the cover and the surface of the cover-bonding portion, thereby curing the photo-curable adhesive. This may ensure the bonding strength of the cover, while enabling the display unit to have a narrow picture-frame.

DESCRIPTION OF EMBODIMENTS

Embodiments of the present invention will be described below with reference to the drawings.

First Embodiment

Figure 2:
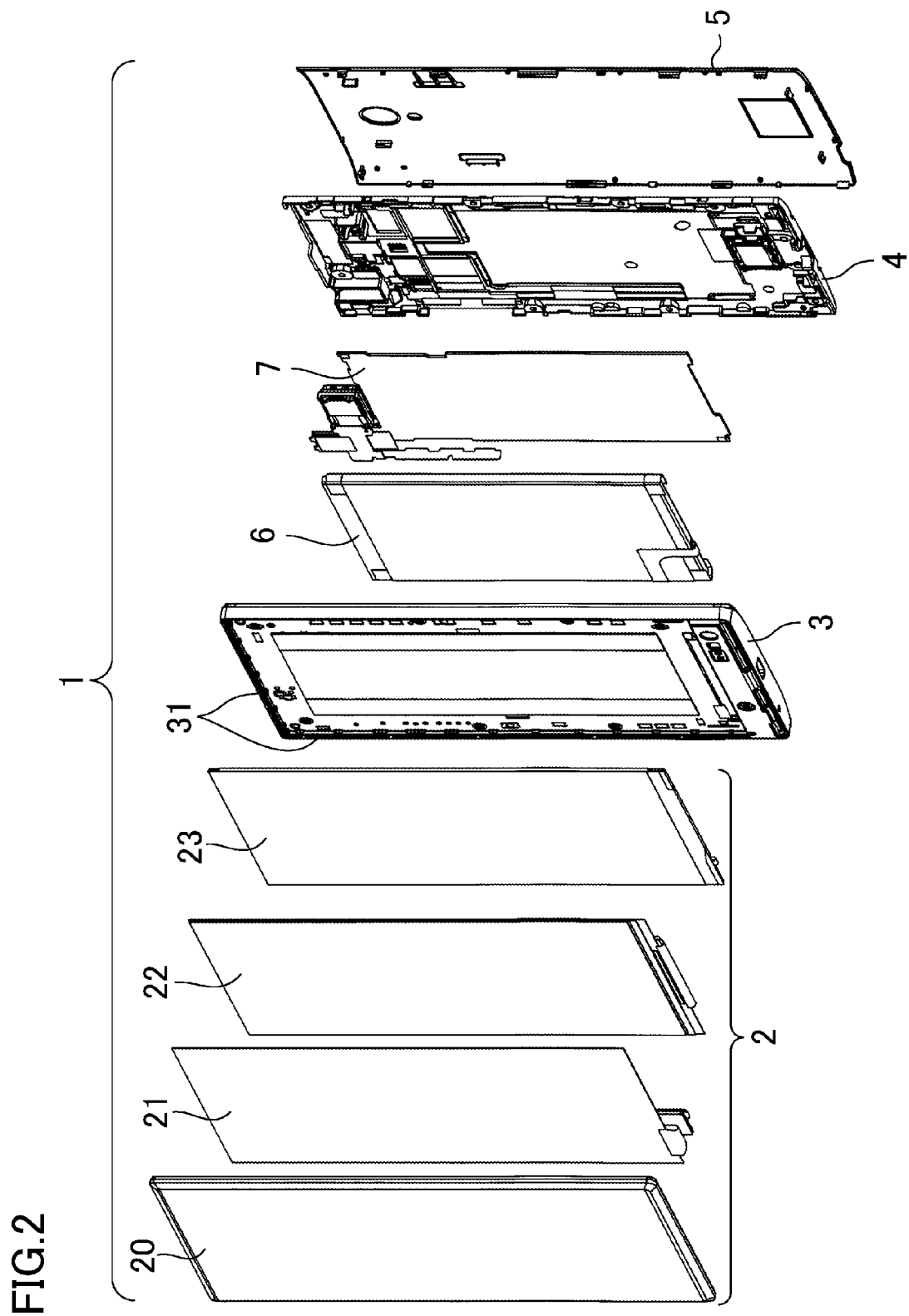
FIG. 2 is an exploded perspective view of a smartphone.

FIG. 2 shows an electronic device according to a first embodiment of the present invention, which is configured as a smartphone 1. This smartphone 1 includes a display 2, a front-side cabinet 3 housing therein the display 2, a backside cabinet 4 covering the back of the front-side cabinet 3, and a rear cover 5 covering the back of the backside cabinet 4. For example, a rechargeable battery 6 and a circuit board 7 are provided between the back of the front-side cabinet 3 and the front of the backside cabinet 4.

Figure 1:
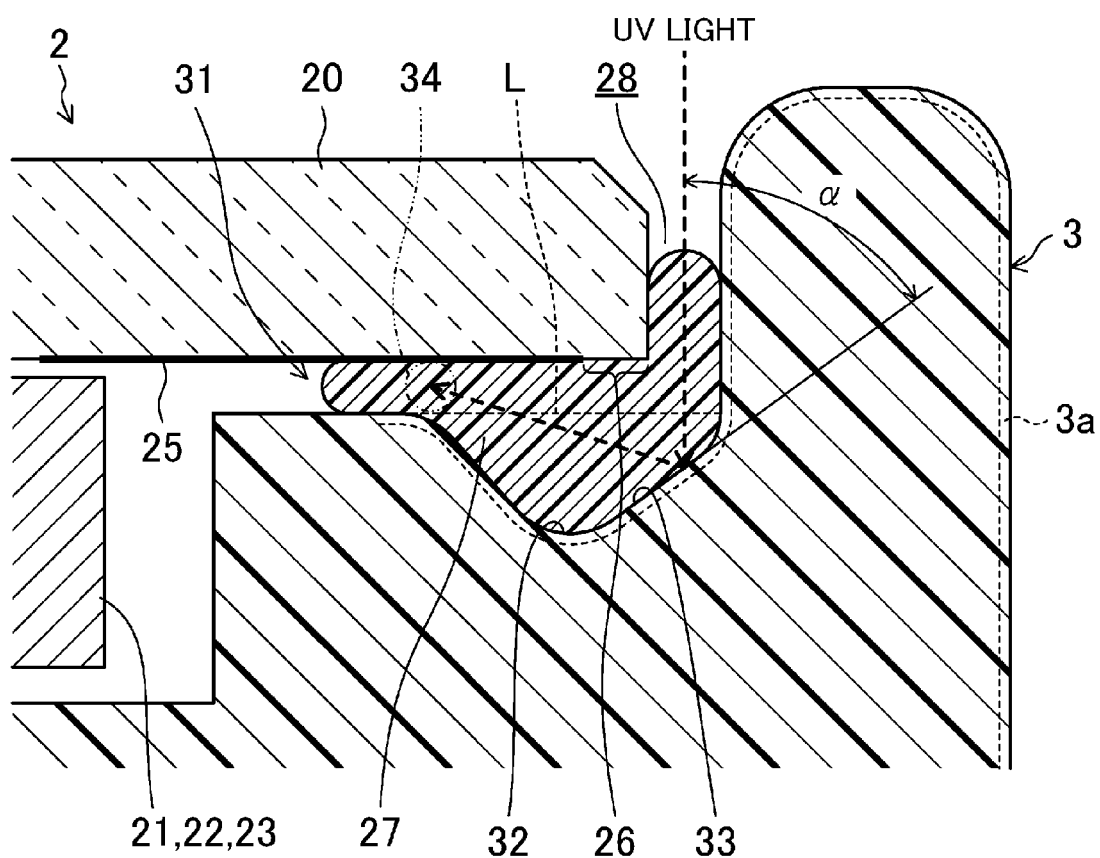
FIG. 1 shows, on an enlarged scale, a cross section of a peripheral edge portion of a smartphone according to a first embodiment.

As shown in FIG. 2, the display 2 includes, for example: a clear and UV-transparent acrylic cover 20; a touch panel 21 bonded to the back of the cover 20; a display unit 22 facing the back of the touch panel 21 and having a liquid crystal panel and other components; and a backlight assembly 23 facing the back of the display unit 22. The cover 20 and the touch panel 21 may be integral with each other. As shown in FIG. 1 on an enlarged scale, the front-side cabinet 3 made of a resin molding has, in its peripheral edge portion, a cover-bonding portion 31 to which the cover 20 is bonded. The cover 20 may be made of glass or a resin material other than acrylic. As can be seen in FIG. 1, a light-shielding treatment implemented as black printing 25 is provided on the backside of a peripheral edge portion of the cover 20 in order to improve the appearance, for example. The portion with the black printing 25 is little transparent to UV. The color of the printing is not limited to black, but may be any color which can block visible light to the extent that the inside cannot be visually identified. The light-shielding treatment is not limited exclusively to the printing, and the blockage of visible light may be achieved by any other process such as in-mold molding or thermal transfer printing. In either case, the blockage of visible light also reduces the transparency to UV, or blocks UV completely. In this embodiment, the black printing 25 is applied such that a non-application region 26 where the black printing 25 is absent is intentionally left between the black printing 25 and an end the backside of the peripheral edge of the cover 20, without allowing the appearance to become unattractive. For example, this non-application region 26 has a width of about 0.3 mm.

Further, the cover-bonding portion 31 of this embodiment has an overflow prevention recess 32 into which a photo-curable adhesive configured as a UV-curable adhesive 27 and provided between the peripheral edge portion of the cover 20 and the cover-bonding portion 31 flows. In known art, the surface of the cover-bonding portion 31 is flat as indicated by reference character L in FIG. 1. Although the UV-curable adhesive 27 may be acrylic-based one or epoxy-based one, and may be clear or translucent, it is recommended that the UV-curable adhesive 27 have a high transparency to UV. The overflow prevention recess 32 extends, in the form of a substantially continuous groove, around the outer periphery of the display 2, and in conformity with the peripheral edge of the cover 20. The overflow prevention recess 32 does not have to have the same cross section in the entire region in the longitudinal direction. The overflow prevention recess 32 has a size (a capacity) which is suitable for preventing the UV-curable adhesive 27 from overflowing through a gap 28 between the front-side cabinet 3 and the cover 20 to the outside when the UV-curable adhesive 27 is applied. Thus, this configuration may prevent the overflow of the UV-curable adhesive 27 during the application of the adhesive, thereby avoiding allowing the appearance to be unattractive after the bonding.

At least the surface of a portion including and surrounding the overflow prevention recess 32 is provided with a surface treatment 3a for reflecting UV, such as a coating or an evaporated film. This surface treatment 3a may extend also over an externally visible portion of the front-side cabinet 3, and does not have to cover the entire surface of the overflow prevention recess 32.

For example, as shown in FIG. 1, the overflow prevention recess 32 has a reflection surface 33 which forms, for example, an angle α of 54° with UV which is indicated by the broken line arrow and travels straight through the gap 28 between the side surface of the cover 20 and the inner surface of the peripheral edge of the front-side cabinet 3. For example, UV which has traveled straight is reflected by the reflection surface 33 and caused to reach a UV target region 34 which is located inward relative to the overflow prevention recess 32 and which has narrower space. The angle α is set to a suitable degree which facilitates the travel of UV that has passed through the gap 28 and the non-application region 26, to the UV target region 34. Thus, this configuration causes emitted UV to be reflected by the reflection surface 33 of the overflow prevention recess 32, and to reach the UV target region 34 that is located inward relative to the black printing 25 and between the backside of the peripheral edge portion of the cover 20 and the cover-bonding portion 31, thereby curing the UV-curing adhesive 27.

Note that since UV also passes through the inside of the cover 20, UV that has passed through the non-application region 26 where the black printing 25 is absent hits the UV-curing adhesive 27 and promotes the curing of the UV-curing adhesive 27.

In a known electronic device, the black printing 25 applied to the cover 20 in order to improve the appearance blocks UV and prevents the same from reaching space located inward relative to the black printing 25. In contrast, according to this embodiment, UV is reflected by the reflection surface 33 of the overflow prevention recess 32 and caused to reach the UV target region 34. Consequently, it may be ensured that the UV-curing adhesive 27 is cured and the bonding strength is maintained.

When the UV-curing adhesive 27 is applied, the UV-curing adhesive 27 flows into the overflow prevention recess 32 having a suitable capacity. This may prevent the UV-curing adhesive 27 from overflowing through the gap 28 or any other portion.

Further, since the non-application region 26 is intestinally left, even if the cover 20 is displaced in the lateral direction of the smartphone 1 and the gap 28 is partially closed by the side surface of the cover 20 that come into contact with the front-side cabinet 3, UV that has passed through the non-application region 26 may reach and cure the UV-curing adhesive 27.

Furthermore, the bonding area of this embodiment is larger, by the area of the overflow prevention recess 32, than that in a case where the cover-bonding portion 31 has a flat surface. This contributes to an increase in the bonding strength.

In addition, the surface treatment 3a covers not only the overflow prevention recess 32 and the region surrounding the recess 32, but also the externally visible portion of the front-side cabinet 3. This may eliminate the need for adding a treatment exclusively for the reflection of UV, while enabling efficient reflection of UV.

Thus, according to the smartphone 1 of this embodiment, UV is caused to reach the UV-curing adhesive 27 that is provided inward relative to the black printing 25, thereby reliably curing the UV-curing adhesive 27. As a result, the bonding strength of the cover 20 may be maintained, while enabling the display 2 to have a narrow picture-frame.

—Variation of First Embodiment—

Figure 3:
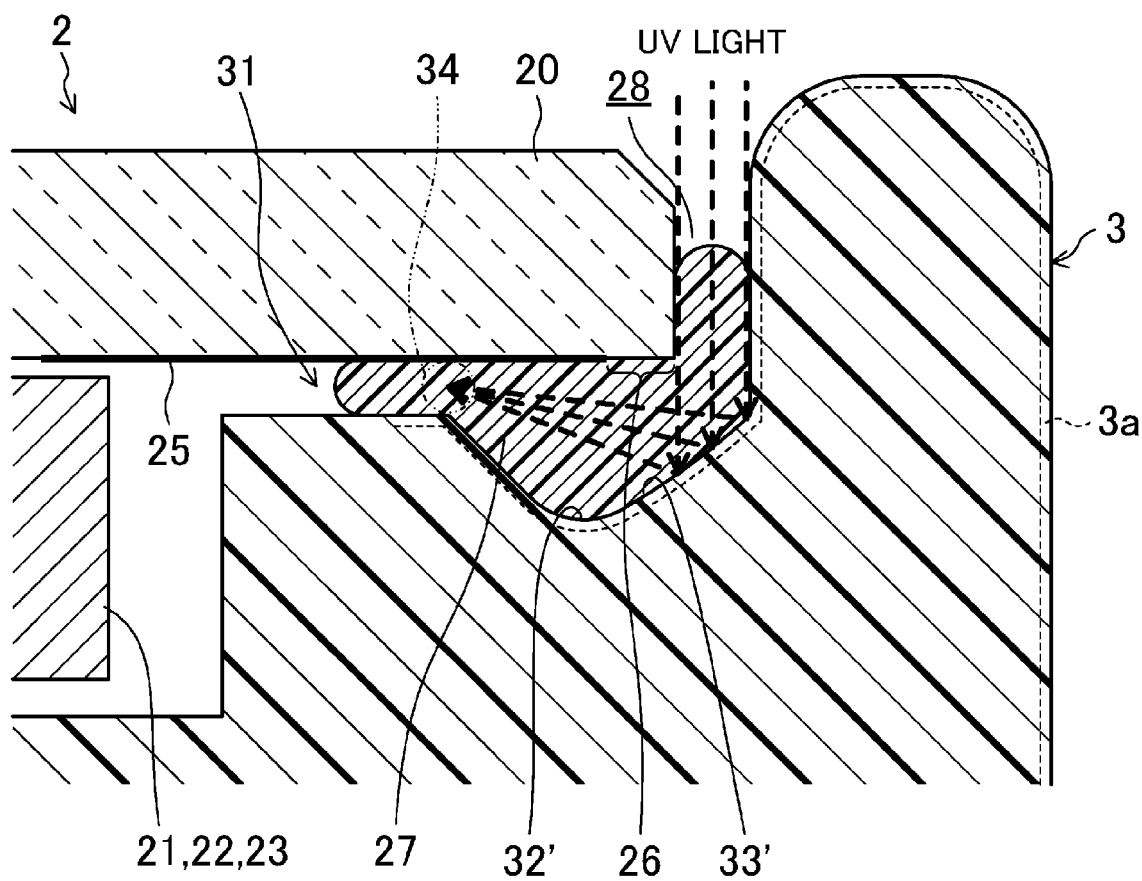
FIG. 3 corresponds to FIG. 1 and shows a variation of the first embodiment.

FIG. 3 shows a variation of the first embodiment of the present invention. This variation has an overflow prevention recess 32' which has a shape different from that of the overflow prevention recess 32 of the first embodiment. Note that in the following variations and second embodiment, components that are the same as those shown in FIGS. 1 and 2 will be identified by the corresponding reference characters, and detailed description thereof will be omitted herein.

The overflow prevention recess 32' of this variation has a cross section different from that of the embodiment described above. The overflow prevention recess 32' has a reflection surface 33' curved in an arc shape which causes UV to reach space which is located inward relative to the black printing 25 and is between the backside of the peripheral edge portion of the cover 20 and the cover-bonding portion 31. This shape of the recess 32' may be an elliptical arc, a curve of the $n^{th}$ order, or a combination thereof.

With this configuration, as shown in FIG. 3 for example, UV which has traveled through the gap 28 is reflected by the curved reflection surface 33' and caused to reach the UV target region 34 located inward relative to the black printing 25 efficiently. As a result, the UV-curing adhesive 27 may be cured reliably.

Second Embodiment

Figure 4:
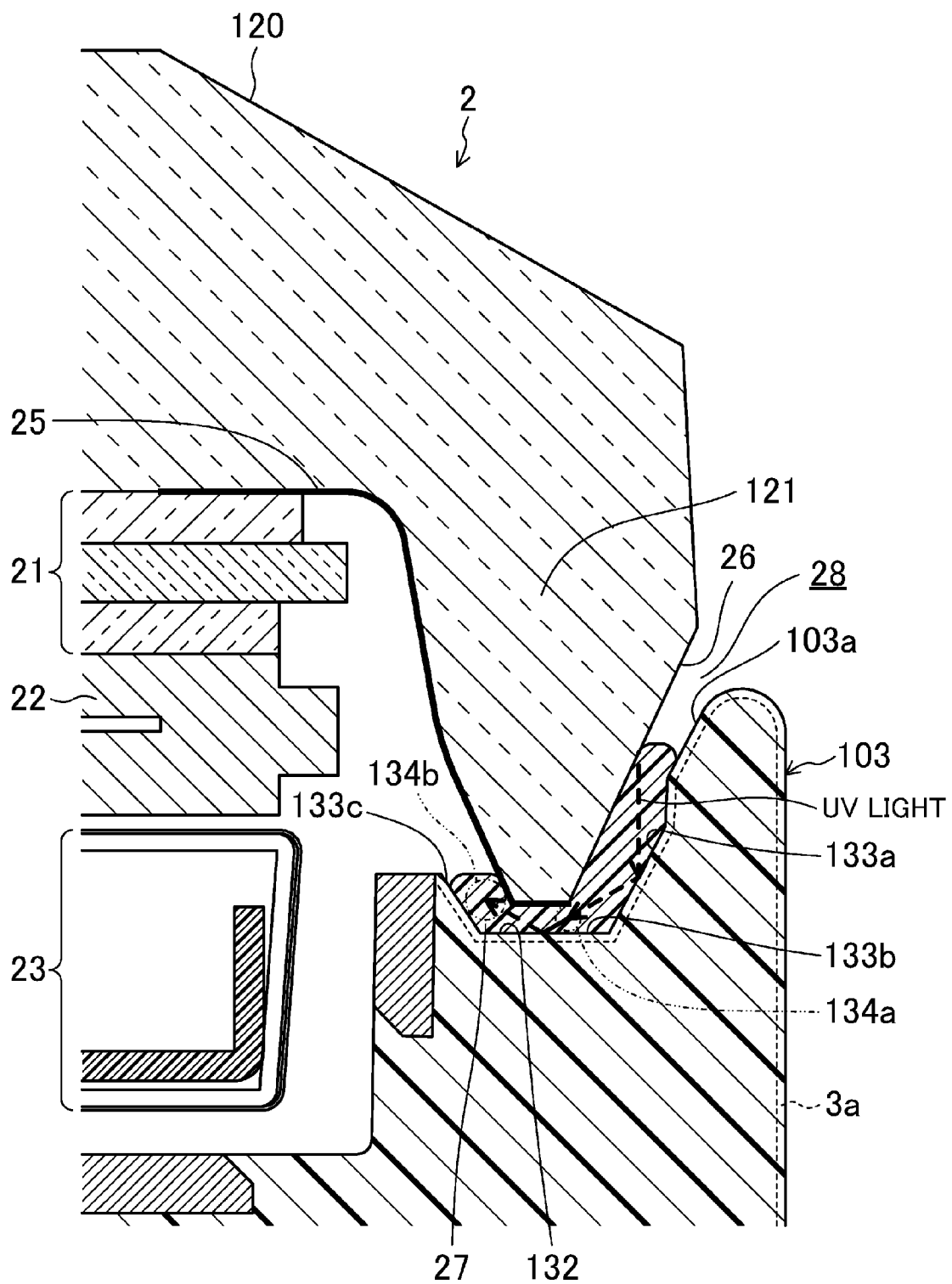
FIG. 4 corresponds to FIG. 1 and shows a second embodiment.

FIG. 4 shows the second embodiment of the present invention. The main differences between the first and the second embodiments are the shapes of a cover 120 and an overflow prevention recess 132.

The cover 120 has a continuous protrusion 121 protruding from the peripheral edge portion of the cover 120 toward the cover-bonding portion 31. If the cover 120 is made of a molding of resin such as acrylic, the non-application region 26 where the black printing 25 is absent is provided on a surface cut by performing cutting, for example. Therefore, the surface of the non-application region 26 is coarser than the other surfaces not subjected to cutting.

The protrusion 121 is transparent to UV. Therefore, UV emitted to the inside of the protrusion 121 is refracted or reflected, and caused to pass through the non-application region 26. The UV then travels toward the UV-curing adhesive 27. Since the non-application region 26 is provided on the cut surface, UV is diffused in a relatively wide range.

In FIG. 4, the broken line arrows indicate exemplary UV rays which have been refracted or reflected inside the protrusion 121 and come out through the non-application region 26. Actually, UV is diffused in the all directions, and a wide range is irradiated with the UV. In addition, some UV rays travel directly through the gap 28 between the protrusion 121 and the peripheral edge of the front-side cabinet 3. The representative UV rays indicated by the broken line arrows are reflected sequentially by a first reflection surface 133a and a second reflection surface 133b which intersect with each other at a predetermined angle. Consequently, the UV rays are caused to reach sequentially and effectively a first UV target region 134a and a second UV target region 134b which are located inward relative to the black printing 25 and are narrower. As a result, the UV-curing adhesive 27 may be cured reliably.

In particular, the cover 120 of this embodiment has the special shape having the protrusion 121, which allows the UV-curing adhesive 27 to be efficiently irradiated with UV that has passed through the inside of the protrusion 121.

Further, the surface of the overflow prevention recess 132 includes the first reflection surface 133a and the second reflection surface 133b that intersect with each other at the predetermined angle so as to cause UV to reach an inner portion of the protrusion 121 where the black printing 25 is provided. This configuration may ensure that the UV reaches the first UV target region 134a and the second UV target region 134b. Note that three or more reflection surfaces may be provided. As shown in FIG. 4, a surface located inward relative to the second UV target region 134b may be caused to function as a third reflection surface 133c.

Figure 5:
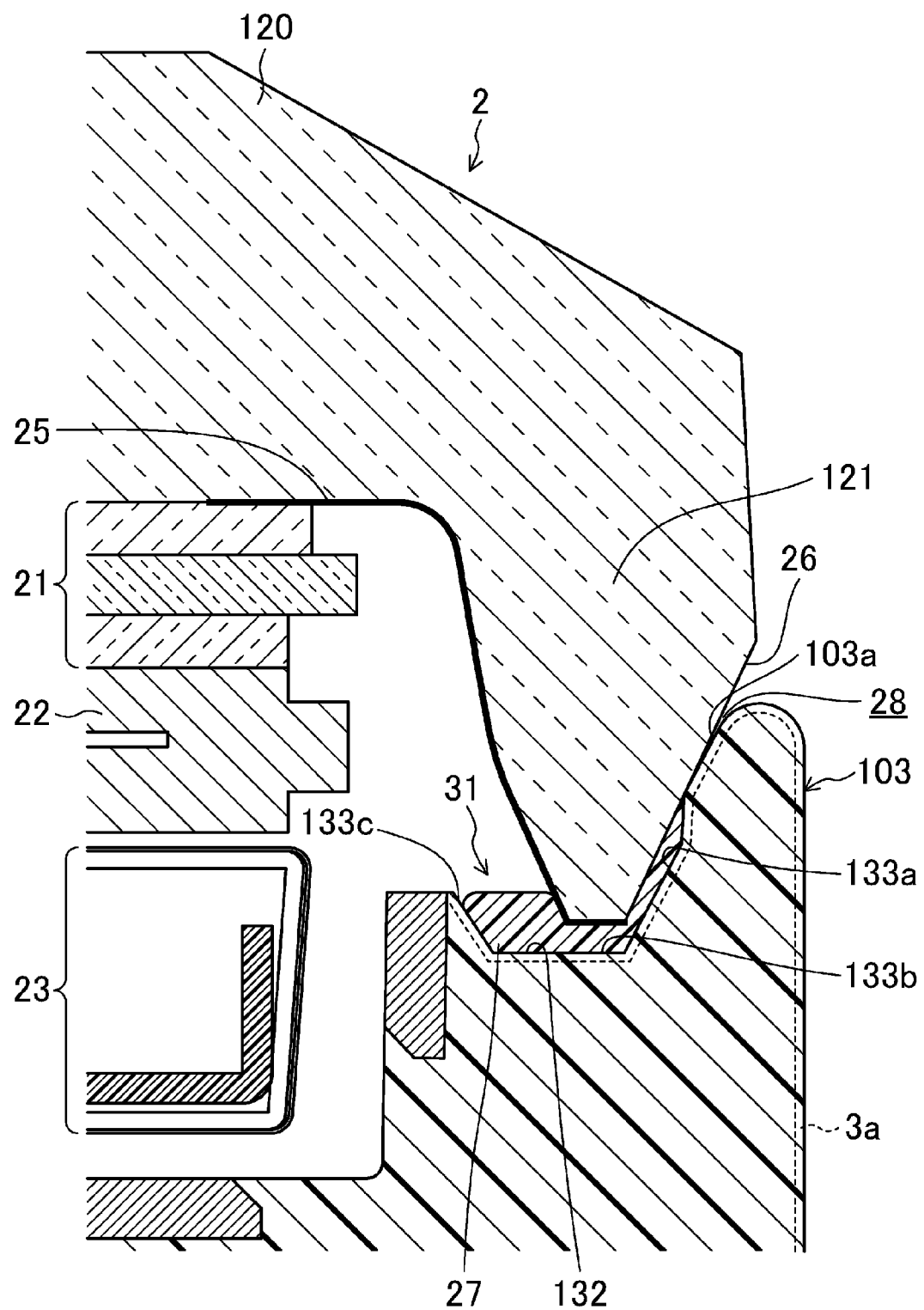
FIG. 5 corresponds to FIG. 4, and shows a cover of the second embodiment which has been displaced laterally.

As shown in FIG. 5, according to this embodiment, even if the cover 120 is displaced in the lateral direction of the smartphone 1, a portion of the non-application region 26 comes into contact with a contact surface 103a located on the peripheral edge of the overflow prevention recess 132, and a gap is ensured between another portion of the non-application region 26, which is out of contact with the contact surface 103a, and the first reflection surface 133a. This causes the UV-curing adhesive 27 to have a predetermined thickness in spite of the lateral displacement of the cover. Also in this case, the UV-curing adhesive 27 is irradiated with UV that has passed through the inside of the cover 120 via the non-application region 26, which may ensure that the UV-curing adhesive 27 is cured.

In a situation where the UV-curing adhesive 27 has been applied, placing the cover 120 at a predetermined position for bonding causes the protrusion 121 to push part of the UV-curing adhesive 27 out of the recess. At this time, if the cover 120 has been displaced in the lateral direction of the smartphone 1 as shown in FIG. 5, the UV-curing adhesive 27 might disadvantageously overflow through the gap 28. However, since the overflow prevention recess 132 has room extending beside the cover-bonding portion 31, the part of the UV-curing adhesive 27 that has been pushed out flows into this room, which may prevent the UV-curing adhesive 27 from overflowing to the outside.

—Variation of Second Embodiment—

Figure 6:
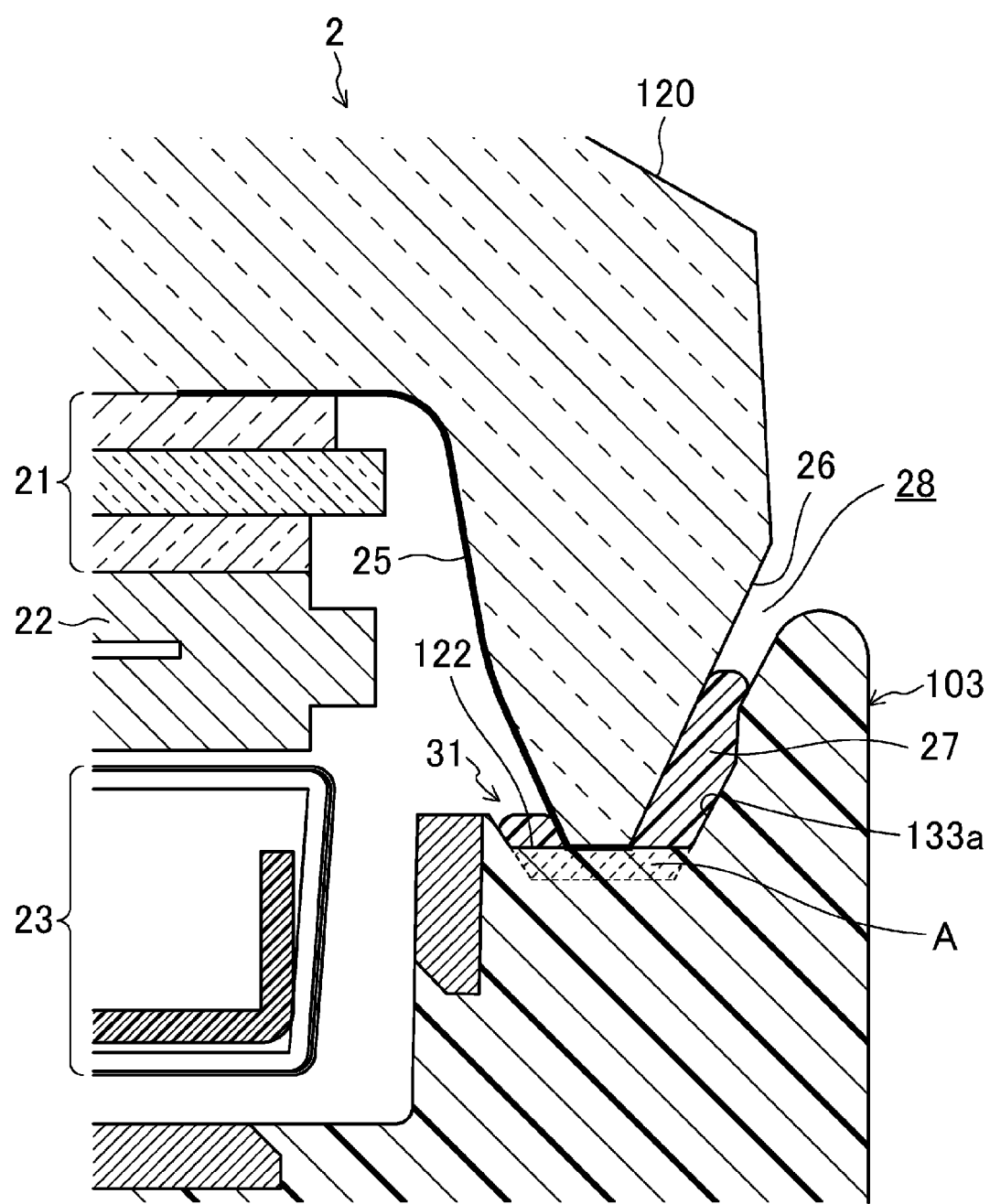
FIG. 6 corresponds to FIG. 1 and shows a variation of the second embodiment.

FIG. 6 shows a variation of the second embodiment of the present invention. This variation differs from the second embodiment in that the variation includes ribs 122.

This variation has, in addition to the components included in the second embodiment, the plurality of ribs 122 formed on the surface of the overflow prevention recess 32. These ribs 122 intersect with the longitudinal direction of the overflow prevention recess 32 and are arranged at arbitrary intervals. Specifically, in this embodiment, each of the ribs 122 extends in a linear manner and perpendicularly to the longitudinal direction of the overflow prevention recess 32. However, each rib may intersect with the longitudinal direction of the overflow prevention recess 32 at an angle smaller than 90° or may have a curved shape. The width of each rib 122 and the interval between the ribs 122 may be set suitably such that the bonding strength of the UV-curing adhesive 27 is not reduced.

If the ribs 122 were absent unlike this variation, force acting in the thickness direction of the smartphone 1 (downward in FIG. 6) would cause the tip end of the protrusion 121 having the black printing 25 to come into contact with the second reflection surface 133b of the overflow prevention recess 132. This situation would prevent UV from traveling inward, resulting in insufficient curing of the UV-curing adhesive 27.

In this variation, however, the plurality of ribs 122 limit the depth to which the protrusion 121 is pushed down toward the overflow prevention recess 132 to a predetermined depth. Therefore, a clearance is ensured in each interval (indicated by reference character A in FIG. 6) between the ribs 122, which allows at least certain amount of the UV-curing adhesive 27 to be held in the clearance. Consequently, UV may pass through the ensured clearances and reliably reaches the second UV target region 134b, and the UV-curing adhesive 27 may be cured reliably.

Other Embodiments

The embodiments of the present invention described above may be modified as follows.

In the embodiments above described, the black printing 25 is provided on the backside of the peripheral edge portion of the cover 20 or 120. Instead, the black printing 25 may be provided on the front side of the peripheral edge portion. However, the advantages of the present invention will be appreciated more remarkably when the black printing is provided on the backside because such configuration makes it more difficult for UV to reach inner space.

In the second embodiment, the first to third reflection surfaces 133a, 133b, and 133c are configured as flat surfaces. However, the number of the reflection surfaces is not limited to this, and each reflection surface may have a curved cross section.

The embodiments described above include the non-application region 26. This non-application region 26 does not necessarily have to be provided. Even without the non-application region 26, it is suitable that UV passing through the gap 28 is reflected and caused to reach the UV target regions.

In the embodiments described above, the photo-curable adhesive is configured as the UV-curing adhesive 27. However, this is merely an example, and a visible light-curable adhesive may be used instead of the UV-curing adhesive 27. The use of such a visible light-curable adhesive provides advantages that: the adhesive can be cured by irradiation of light through a material impervious to UV; visible light is safer than UV; and the irradiated position and the state thereof can be visually identified.

In the embodiments described above, the electronic device is configured as the smartphone 1. However, the electronic device may also be configured as a general mobile phone, a tablet terminal, a personal handy-phone system (PHS), a personal digital assistant (PDA), a PC, a mobile tool, an electronic dictionary, a calculator, a game console, or any other electronic device. The electronic device may also be configured as an electronic device including a display unit, such as a small liquid crystal display or an LCD television.

Note that the embodiments described above are merely preferred examples in nature, and are not intended to limit the scope, application, or uses of the present invention. The technical features specified in the foregoing description of the embodiments may be combined with each other, and such a combination may create a new technical feature.

DESCRIPTION OF REFERENCE CHARACTERS

1 Smartphone (Electronic Device)
2 Display
3 Front-side Cabinet (Cabinet)
3a Surface Treatment
4 Backside Cabinet
5 Rear Cover
6 Rechargeable Battery
7 Circuit Board
20 Cover
21 Touch Panel
22 Display Unit
23 Backlight Assembly
25 Black Printing (Light-shielding Treatment)
26 Non-application Region
27 UV-curing Adhesive (Photo-curable Adhesive)
28 Gap
31 Cover-bonding Portion
32, 32' Overflow Prevention Recess (Recess)
33, 33' Reflection Surface
34 UV Target Region
103a Contact Surface
120 Cover
121 Protrusion
122 Rib
132 Overflow Prevention Recess (Recess)
133a First Reflection Surface
133b Second Reflection Surface
133c Third Reflection Surface
134a First UV Target Region
134b Second UV Target Region

The invention claimed is:

1. An electronic device comprising: a display unit; a cover which covers the display unit; and a cabinet having a cover-bonding portion to which the cover is bonded, wherein
a peripheral edge portion of the cover is provided with a light-shielding treatment which is little transparent to or impervious to UV or visible light,
the cover-bonding portion has a recess into which a photo-curable adhesive provided between the cover-bonding portion and the peripheral edge portion of the cover flows, and
the electronic device is configured such that emitted UV or visible light is reflected by a surface of the recess and caused to reach space which is located inward relative to the light-shielding treatment and which is between a backside of the peripheral edge portion of the cover and a surface of the cover-bonding portion.

2. The electronic device of claim 1, wherein
the recess extends not only along the backside of the peripheral edge portion of the cover, but also to a position corresponding to a side surface of the cover.

3. The electronic device of claim 1, wherein
the light-shielding treatment is provided such that a non-application region where the light-shielding treatment is absent is left between the light-shielding treatment and a side surface of the peripheral edge portion of the cover.

4. The electronic device of claim 1, wherein
at least a surface of the recess is provided with a treatment for reflecting UV or visible light.

5. The electronic device of claim 1, wherein
the recess has such a size that prevents the photo-curable adhesive from overflowing through a gap between the cabinet and the cover when the photo-curable adhesive is applied.

6. The electronic device of claim 1, wherein
the cover has a protrusion protruding from the peripheral edge portion of the cover toward the cover-bonding portion, and
the electronic device is configured such that UV or visible light which has been refracted or reflected by passing through an inside of the protrusion cures the photo-curable adhesive.

7. The electronic device of claim 6, wherein
a plurality of ribs configured to limit a depth to which the protrusion is pushed toward the recess are formed on the surface of the recess, and the ribs are arranged so as to intersect with a longitudinal direction of the recess.

8. The electronic device of claim 6, wherein
a contact surface is formed on a peripheral edge portion of the recess such that a predetermined amount of the photo-curable adhesive is held in the recess when the cover comes into contact with the contact surface.

9. The electronic device of claim 7, wherein
a contact surface is formed on a peripheral edge portion of the recess such that a predetermined amount of the photo-curable adhesive is held in the recess when the cover comes into contact with the contact surface.

* * * * *